United States Patent
Lin

(10) Patent No.: US 7,106,142 B2
(45) Date of Patent: Sep. 12, 2006

(54) RING-TYPE VOLTAGE OSCILLATOR WITH IMPROVED DUTY CYCLE

(75) Inventor: Yu-Hong Lin, Taipei (TW)

(73) Assignee: Via Technologies Inc., Taipei (TW)

( * ) Notice: Subject to any disclaimer, the term of this patent is extended or adjusted under 35 U.S.C. 154(b) by 52 days.

(21) Appl. No.: 11/028,035

(22) Filed: Jan. 3, 2005

(65) Prior Publication Data
US 2006/0145773 A1 Jul. 6, 2006

(51) Int. Cl.
*H03B 27/00* (2006.01)
(52) U.S. Cl. .............. 331/57; 331/108 A; 331/45; 327/266; 327/274; 327/287
(58) Field of Classification Search ............ 331/57, 331/108 A, 45; 327/161, 158, 266, 274, 327/287
See application file for complete search history.

(56) References Cited

U.S. PATENT DOCUMENTS 6,900,703 B1 * 5/2005 Garvin .............. 331/183

OTHER PUBLICATIONS

Chan-Hong Park and Beomsup Kim, "A Low Noise, 900 MHZ VCO in 0.6 um CMOS", IEEE Journal of Solid-State Circuits, May 1999.*

* cited by examiner

*Primary Examiner*—Joseph Chang
*Assistant Examiner*—Levi Gannon
(74) *Attorney, Agent, or Firm*—Thomas, Kayden, Horstemeyer & Risley

(57) ABSTRACT

A ring-type voltage-controlled oscillator with a good duty cycle for use in a PLL frequency synthesizer. The delay cell circuit used in the ring-type VCO comprises two first inverters, two resistance units, and a differential delay circuit. The inverters receive respective differential input signals and generate respective differential signals to resistance units. The differential delay circuit is coupled to the resistance units, generating differential output signals which are a delayed version of the differential input signals. The resistance units have a resistance value adjusted according to a resistance control voltage for controlling the strength of inverters so as to alter the time delay of the first and second differential output signals.

20 Claims, 4 Drawing Sheets

RING-TYPE VOLTAGE OSCILLATOR WITH IMPROVED DUTY CYCLE

BACKGROUND

The invention relates to a ring-type voltage oscillator, and more particularly to a ring-type oscillator with improved duty cycle.

In recent years, the rapid growth of cellular communications systems has motivated an increasing demand for high performance integrated radio frequency (RF) components, such as frequency synthesizers. Phase-locked loop (PLL) techniques have been widely used in frequency synthesis to meet the stringent requirements of wireless standards. Among the function blocks in a PLL, VCO (Voltage-controlled oscillator) is a crucial circuit for determining the characteristics of a PLL. A desirable VCO offers a broad frequency band, realizes stable oscillation, and has low noise characteristics.

Ring-type oscillator is one kind of voltage-controlled oscillators. It is realized by cascading several delay cells to form a closed loop. FIG. 1 is a block diagram of a conventional ring-type oscillator 10. Operation of delay cells 12a, 12b and 12c in the ring-type oscillator is similar to an inverter and each delay cell generates a complement output signal with a time delay added to an input signal. The amount of time delay dictates the frequency at which the ring-type oscillator operates. The greater the delay time, the lower the frequency. That is, the frequency of the ring-type oscillator is inversely proportional to the total delay time of the delay cell in the loop. Ring-type oscillators provide advantages such as wide operating-frequency range and no extra processing step in a standard CMOS process, compared to other kind of VCOs, such as a LC-tank VCO.

However, VCOs including ring-type oscillators usually show poorer phase-noise performance, such as duty cycle distortion which may result in a poor bit-error rate and an inferior lock-in range of a clock and data recovery circuit. The duty cycle fluctuation of a ring-type oscillator may stem from the mismatch of transistors or extrinsic parameters, for example, device processing temperature, voltage and/or frequency of the frequency synthesizer. To solve this problem, a duty cycle correction circuit is usually added in a frequency synthesizer. However, this increases the power consumption and circuit complexity of the frequency synthesizer. Therefore, it is desirable to have a ring-type oscillator with an improved duty cycle.

SUMMARY

The present invention is generally directed to a ring-type voltage-controlled oscillator for use in a PLL frequency synthesizer. According to one aspect of the invention, the ring type voltage-controlled oscillator comprises a plurality of delay cell circuits, wherein each delay cell circuit has at least an output coupled to an input of a next sequential delay cell circuit in the ring-type voltage-controlled oscillator. One of the delay cell circuits comprises a first inverter, a second inverter, a first resistance unit, a second resistance unit and a differential delay circuit. The first inverter comprises a first NMOS transistor having a gate receiving a first differential input signal, a drain generating a first differential signal and a source coupled to a second power rail. The second inverter comprises a second NMOS transistor having a gate receiving a second differential input signal and a drain generating a second differential signal and a source coupled to the second power rail. The first resistance unit is coupled to the drain of the first NMOS transistor, and receives the first differential signal. The second resistance unit is coupled to the drain of the second NMOS transistor, and receives the second differential signal. The differential delay circuit is coupled to a first power rail for generating a first differential output signal to a first terminal and the first resistance unit, and a second differential output signal to a second terminal and the second resistance unit. The first and second resistance units have a resistance value adjusted according to a resistance control voltage for controlling the strength of the first and the second NMOS transistor so as to alter the time delay of the first and second differential output signal.

According to another aspect of the invention, a delay cell circuit for a ring-type voltage-controlled oscillator is disclosed. The delay cell circuit comprises a first inverter, a second inverter, a first resistance unit, a second resistance unit and a differential delay circuit. The first inverter comprises a first NMOS transistor having a gate receiving a first differential input signal, a drain generating a first differential signal and a source coupled to a second power rail. The second inverter comprises a second NMOS transistor having a gate receiving a second differential input signal and a drain generating a second differential signal and a source coupled to the second power rail. The first resistance unit is coupled to the drain of the first NMOS transistor, and receives the first differential signal. The second resistance unit is coupled to the drain of the second NMOS transistor, and receives the second differential signal. The differential delay circuit is coupled to a first power rail for generating a first differential output signal to a first terminal and the first resistance unit, and a second differential output signal to a second terminal and the second resistance unit. The first and second resistance units have a resistance value adjusted according to a resistance control voltage for controlling the strength of the first and the second NMOS transistor so as to alter the time delay of the first and second differential output signal.

DESCRIPTION OF THE DRAWINGS

The present invention will be described by way of exemplary embodiments, but not limitations, illustrated in the accompanying drawings in which like references denote similar elements, and in which.

DETAILED DESCRIPTION

Figure 1:
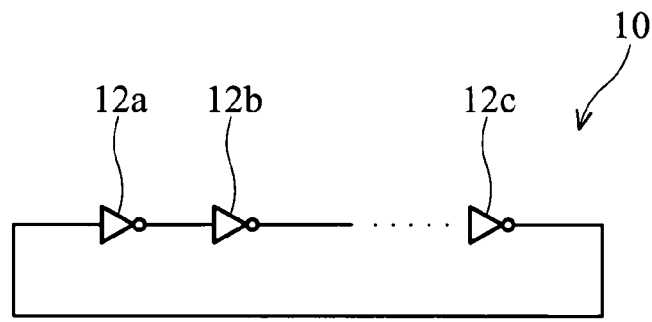
FIG. 1 is a block diagram of a conventional ring-type oscillator.
Figure 2:
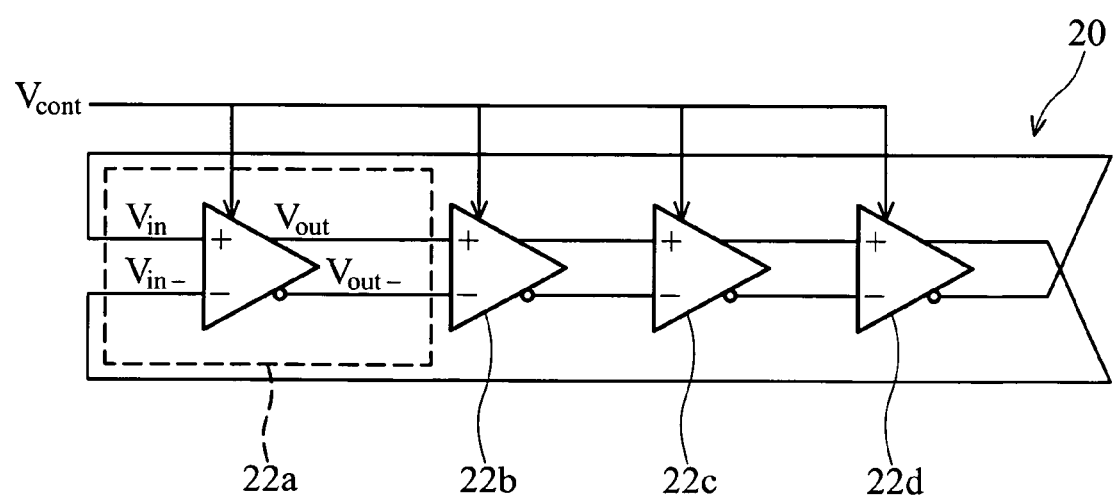
FIG. 2 is a block diagram of a ring-type voltage-controlled oscillator in accordance with an embodiment of the invention.

With reference to FIG. 2, a ring-type voltage-controlled oscillator 20 in one embodiment of the present invention is illustrated. The ring-type VCO 20 includes four identical delay cell circuits 22a, 22b, 22c and 22d, each having two differential input signals $V_{in}$ and $V_{in-}$ and two differential output signals $V_{out}$ and $V_{out-}$. Differential output signal $V_{out}$ of delay cell circuit 22a is fed to the positive input of delay cell circuit 22b, and then to the next stage in a similar fashion. Differential output signal $V_{out}$ of delay cell circuit 22d, the last stage of the ring-type VCO 20, is fed back to the negative input of delay cell circuit 22a. Similarly, differential output signal $V_{out\_}$ of delay cell circuit 22a is fed to the negative input of delay cell circuit 22b and then to the next stage in the similar fashion. Differential output signal $V_{out\_}$ of delay cell circuit 22d, the last stage of the ring-type VCO 20, is fed back to the positive input of delay cell circuit 22a. As such, the differential output signals $V_{out}$ and $V_{out\_}$ in the ring-type VCO 20 will switch between HIGH and LOW states. Each delay cell circuit 22a, 22b, 22c and 22d causes a 45° phase shift, so the phase shifts relative to $V_{in}$ of delay cell circuit 22a are as follows. Differential output signal $V_{out}$ of delay cell circuit 22a is shifted 45°, signal $V_{out}$ of delay cell circuit 22b is shifted 90°, signal $V_{out}$ of delay cell circuit 22c is shifted 135°, and signal $V_{out}$ of delay cell circuit 22d is shifted 180°, fed back to the delay cell circuit 22a. Consequently, the differential output signal $V_{out\_}$ of delay cell circuit 22a is shifted 225°, signal $V_{out\_}$ of delay cell circuit 22b is shifted 270°, signal $V_{out\_}$ of delay cell circuit 22c is shifted 315°, and signal $V_{out\_}$ of delay cell circuit 22d is shifted 360° (ie. 0°). The outputs of the ring-type VCO 20 thus incorporate two output signals which switch between High and LOW sates. Therefore, controlling the delay time in each delay cell circuit by a control voltage $V_{cont}$ can obtain an oscillating output clock of VCOs with desired frequency.

Figure 3:
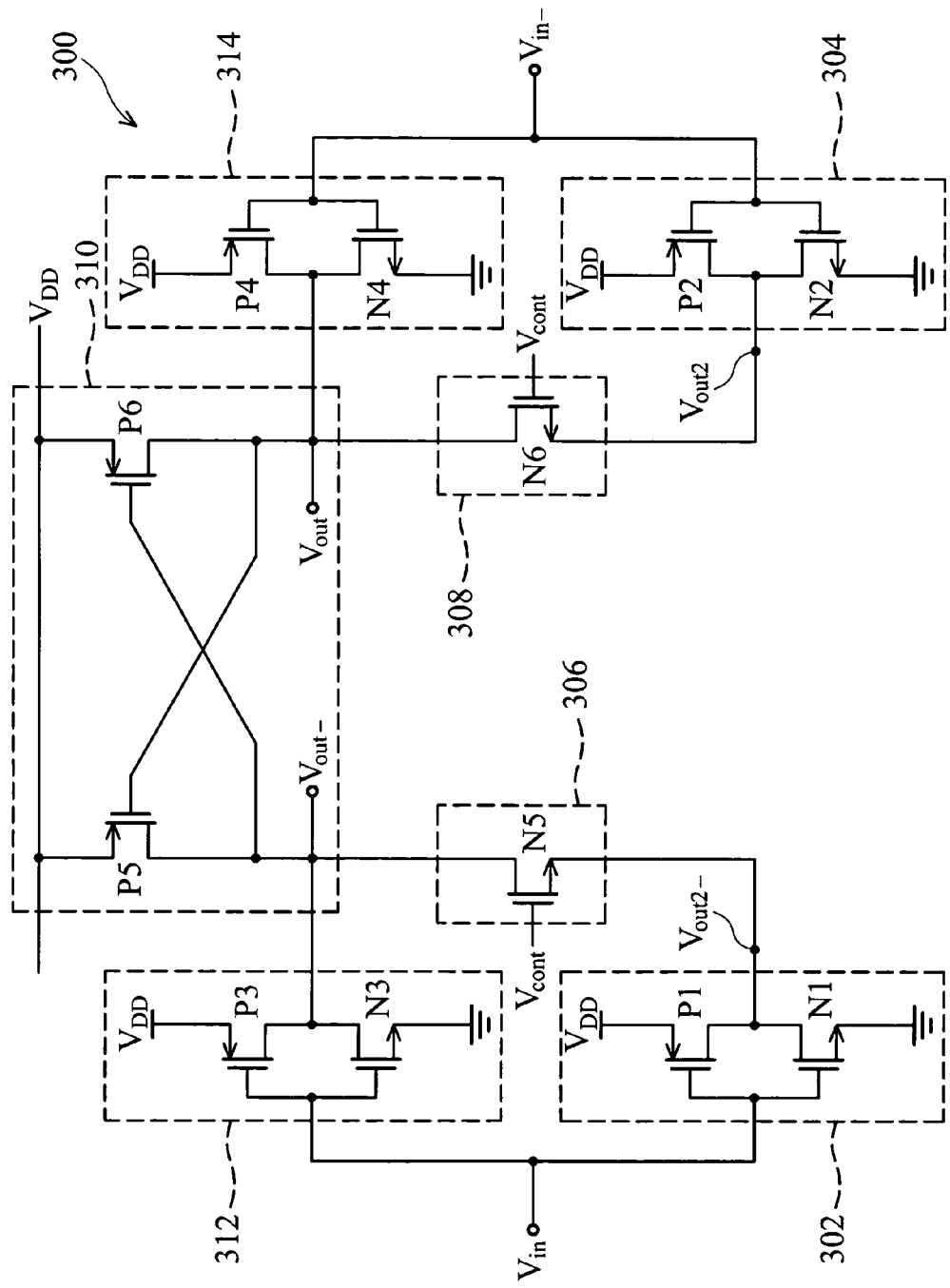
FIG. 3 is a schematic diagram of a delay cell circuit for the ring-type voltage-controlled oscillator of FIG. 2 in accordance with an embodiment of the invention.

FIG. 3 shows the schematic diagram of delay cell circuit 300 for the ring-type VCO 20 of FIG. 2 in accordance with an embodiment of the invention. Recalling that delay cell circuits 22a~22d of the ring-type VCO 20 in FIG. 2 are the same, the delay cell circuit 300 corresponds to any of delay cell circuits 22a~22d. Delay cell circuit 300 comprises four inverters 302, 304, 312 and 314, two resistance units 306 and 308, and a differential delay circuit 310. Moreover, delay cell circuit 300 includes two differential input signals $V_{in}$ and $V_{in\_}$ and two differential output signals $V_{out}$ and $V_{out\_}$ as delay cell circuits 22a~22d in FIG. 2.

Inverters 302, 304, 312 and 314 each consist of an NMOS transistor (N1, N2, N3 and N4 for inverters 302, 304, 312 and 314 respectively) connected in series, drain to drain, with a PMOS transistor (P1, P2, P3 and P4 for inverters 302, 304, 312 and 314 respectively). The sources of transistor P1~P4 and N1~N4 are connected to a power rail $V_{DD}$ and to another power rail, preferably ground, respectively. Each transistor in inverter 302 and 312 (N1, N3, P1, P3) has a common gate to receive the differential input signals $V_{in}$. Similarly, transistors in inverter 304 and 314 (N2, N4, P2, P4) have a common gate to receive the differential input signals $V_{in\_}$. The drain of transistor N1 is connected to the resistance unit 306, supplying a differential signal $V_{out2\_}$ while the drain of transistor N2 is connected to the resistance unit 308, supplying a differential signal $V_{out2}$. The drains of transistors N3 and N4 are connected to the differential delay circuit 310, generating respective differential output signals $V_{out\_}$ and $V_{out}$.

Resistance units 306 and 308 comprise two NMOS transistors, N5 and N6 respectively. Transistors N5 and N6 have sources coupled to the drains of transistors N1 and N2 respectively and gates receiving a resistance control voltage $V_{cont}$, acting as varying resistors to tune the time delay of the delay cell circuit 300. The drains of transistors N5 and N6 are connected to the differential delay circuit 310 and the drains of transistors N3 and N4 respectively.

Differential delay circuit 310 comprises two cross-coupled PMOS transistors P5 and P6. Transistor P5 comprises a gate coupled to the drain of transistor P6, receiving a differential output signal $V_{out}$ and also to the drain of transistor N6. Transistor P6 comprises a gate coupled to the drain of the transistor P5, receiving a differential output signal $V_{out\_}$ and also to the drain of transistor N5. Both the sources of transistors P5 and P6 are coupled to the power rail $V_{DD}$. Thus differential output signals of delay cell circuit 300, $V_{out\_}$ is contributed by the differential delay circuit 310, the inverter 312 and resistance unit 306 and $V_{out}$ is contributed by the differential delay circuit 310, the inverter 314 and resistance unit 308.

The operation of the delay cell circuit 300 is described as follows, assuming the current state of input signal $V_{in}$ is 0V (LOW), and signal $V_{in\_}$ is $V_{DD}$ (HIGH), thus the differential output signal $V_{out\_}$ is $V_{DD}$ (HIGH) and signal $V_{out}$ is 0V (LOW). When the input signal $V_{in}$ is transited from 0V to $V_{DD}$, that is, the input signal $V_{in\_}$ is transited $V_{DD}$ to 0V, signals $V_{in}$ and $V_{in\_}$ are fed to inverters 312,302 and inverters 304,314 respectively. The transistor P3 is turned off and transistor N3 is turned on, starting discharge of the negative output of delay cell circuit 300. Since the transistor P5 was turned on in previous state (i.e. when the input signal $V_{in}$ was 0V), the transistor N3 then competes with transistor P5 to pull the output signal $V_{out\_}$ down when transistor P5 is pulling it up. The transistor P5, however, is turned off when the voltage at gate is charged over a certain voltage by transistor P4 because transistor P4 is turned on when signal $V_{in\_}$ is transited to 0V. The transistor N3 thus discharges the negative output of the delay circuit 300, trying to pull the signal $V_{out\_}$ to 0V. Meanwhile, the signal $V_{out2\_}$ generated by the inverter 302 is also pulled to 0V by transistor N1. The transistor N5 acts as a voltage-controllable resister, operatively discharging the voltage at the negative output of delay circuit 300, thereby is generating a tunable current from drain to source in transistor N5 to help pull the state of signal $V_{out\_}$ to 0V.

Conversely, the transistor P4 is turned on and transistor N4 is turned off when signal $V_{in\_}$ is transited from $V_{DD}$ to 0V. Since the transistor P6 was turned off in previous stage when the input signal $V_{in\_}$ was $V_{DD}$, the transistor P4 charges the positive output of the delay circuit 300, trying to pull the signal $V_{out}$ up. The transistor P6 is turned on when the voltage at gate is less than a certain voltage, starting to pull the signal $V_{out}$ up. Meanwhile, the signal $V_{out2}$ generated by the inverter 304 is also pulled to $V_{DD}$ by transistor P2 through another voltage-controllable resistor, the transistor N6. The drain and source of transistor N6 are thus reversed to draw a current to charge the positive output of the delay cell circuit 300, helping to pull the signal $V_{out}$ up to $V_{DD}$.

The control voltage $V_{cont}$ of resistance units 306 and 308 is controlled to adjust the driving strengths of the inverters 302 and 304 respectively, thereby controlling the impedance of transistors N5 and N6 by voltage $V_{cont}$. When the control voltage $V_{cont}$ is high, charge or discharge of outputs of inverter 312 and 314 is faster. When voltage $V_{cont}$ is Low, charge or discharge is slower. With the resistances units 306 and 308 and the inverters 302 and 304, the transition of the delay cell circuit 300 is thus short and the delay time is controlled. Utilizing such delay cell circuit in a ring-type VCO, the duty cycle of the output clock can be improved and a good duty cycle such as 50% can be obtained.

Figure 4:
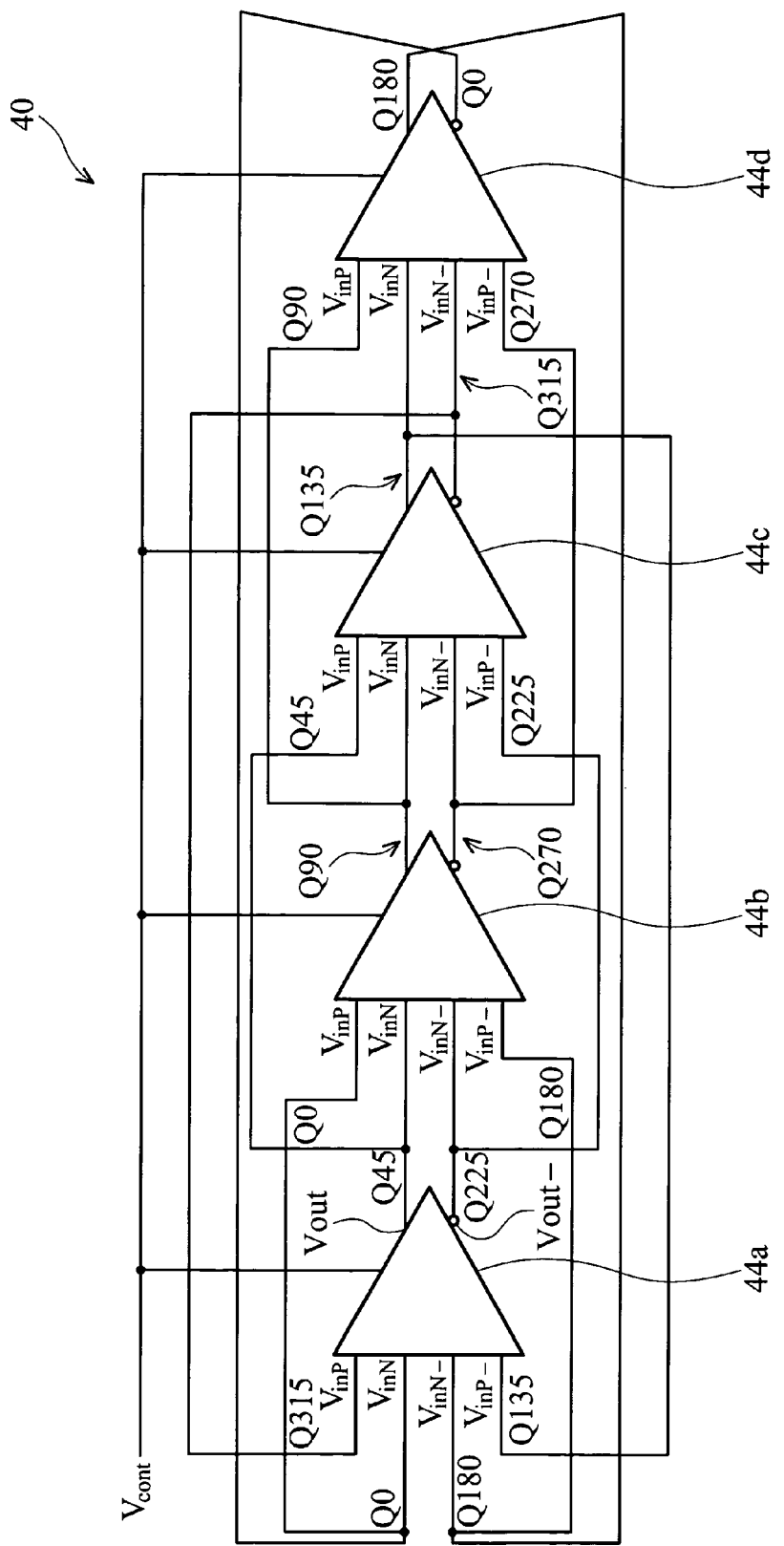
FIG. 4 is a block diagram of a ring-type voltage-controlled oscillator in accordance with another embodiment of the invention.

FIG. 4 illustrates another embodiment of the invention wherein four delay cell circuits 44a~44b form a ring-type VCO 40. Each delay cell circuit in the ring-type VCO 40 has four differential inputs, where $V_{inP}$ and $V_{inP\_}$ is a pair of differential input signals while $V_{inN}$ and $V_{inN\_}$ is another pair. The input signal $V_{inP}$ is 45° faster than signal $V_{inN}$ while signal $V_{inP\_}$ is the same to signal $V_{inN\_}$. That is, when the signal $V_{inN}$ is in Q45 (phase 45°), the signal $V_{inP}$ is in Q0 (phase 0°). The operation of the ring-type VCO 40 is described, accompanied by FIG. 5 as follows.

Figure 5:
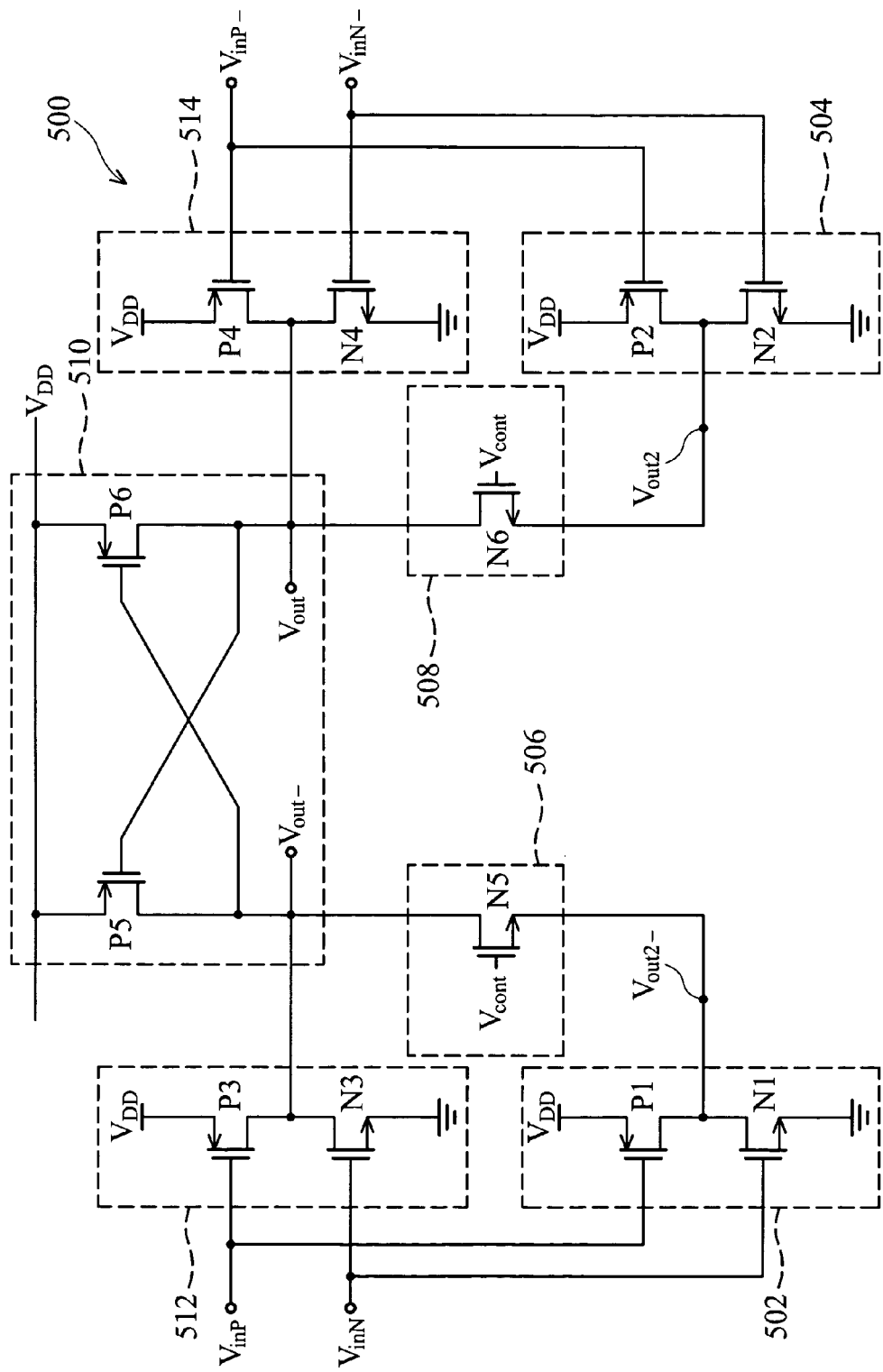
FIG. 5 is a schematic diagram of a delay cell circuit for the ring-type voltage-controlled oscillator of FIG. 4 in accordance with another embodiment of the invention.

FIG. 5 shows a schematic diagram of delay cell circuit 500 of the ring-type VCO 40 in FIG. 4 in accordance with another embodiment of the invention. The delay cell circuit 500 is similar to delay cell circuit 300 except for the PMOS and NMOS transistors in the inverters receiving different differential input signals. In delay cell circuit 500, PMOS transistors P1 and P3 receive a differential input signal $V_{inP}$ and NMOS transistors N1 and N3 receive a differential input signal $V_{inN}$. Furthermore, PMOS transistors P2 and P4 receive a differential input signal $V_{inP\_}$ and NMOS transistors N2 and N4 receive a differential input signal $V_{inN\_}$. Normally, PMOS transistors are slower than NMOS transistor. However, as mentioned, the input signals $V_{inP}$ and $V_{inP\_}$ in the ring-type VCO 40 which utilizes the delay cell circuit 500 in FIG. 5 are 45° faster than signals $V_{inN}$ and $V_{inN\_}$. Thus, the PMOS transistors in delay cell circuit 500 can be triggered earlier and the ring-type VCO can achieve a good duty cycle under most operating frequencies and voltage supplies.

While the invention has been described by way of example and in terms of preferred embodiment, it is to be understood that the invention is not limited thereto. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A ring-type voltage-controlled oscillator comprising a plurality of delay cell circuits, wherein each delay cell circuit has at least an output coupled to an input of a next sequential delay cell circuit in the ring-type voltage-controlled oscillator and one of the delay cell circuits comprises:
    a first inverter comprising a first NMOS transistor having a gate receiving a first differential input signal, a drain generating a first differential signal and a source coupled to a second power rail and a first PMOS transistor having a drain coupled to the drain of the first NMOS transistor, and a source coupled to a first power rail;
    a second inverter comprising a second NMOS transistor having a gate receiving a second differential input signal and a drain generating a second differential signal and a source coupled to the second power rail;
    a first resistance unit coupled to the drain of the first NMOS transistor, receiving the first differential signal;
    a second resistance unit coupled to the drain of the second NMOS transistor, receiving the second differential signal; and
    a differential delay circuit coupled to the first power rail for generating a first differential output signal to a first terminal and the first resistance unit, and a second differential output signal to a second terminal and the second resistance unit;
    wherein the first and second resistance units have a resistance value adjusted according to a resistance control voltage for controlling the strength of the first and second NMOS transistors so as to alter the time delay of the first and second differential output signals.

2. The ring-type voltage-controlled oscillator of claim 1, wherein the second inverters further comprises a_second PMOS transistor, the first PMOS transistor comprises a drain coupled to the drain of the first NMOS transistor, and the second PMOS transistor comprises a drain coupled to the drain of the second NMOS transistor and a source coupled to the first power rail.

3. The ring-type voltage-controlled oscillator of claim 2, wherein the gates of the first and second NMOS transistors are coupled to the gates of the first and second PMOS transistors respectively.

4. The ring-type voltage-controlled oscillator of claim 2, wherein the gate of the first PMOS transistor receives a third differential input signal and the second PMOS transistors receives a fourth differential input signal.

5. The ring-type voltage-controlled oscillator of claim 2, wherein the delay cell circuit further comprises third and fourth inverters, wherein the third inverter comprises a third NMOS transistor having a gate receiving the first differential input signal, a drain coupled to the first terminal and a source coupled to the second power rail, and the fourth inverter comprises a fourth NMOS transistor having a gate receiving the second differential input signal, a drain coupled to the second terminal and a source coupled to the second power rail.

6. The ring-type voltage-controlled oscillator of claim 5, wherein the third and fourth inverters further comprise a third PMOS transistor and fourth PMOS transistor respectively, where the third PMOS transistor comprises a drain coupled to the drain of the third NMOS transistor, and a source coupled to the first power rail, and the fourth PMOS transistor comprises a drain coupled to the drain of the fourth NMOS transistor and a source coupled to the first power rail.

7. The ring-type voltage-controlled oscillator of claim 6, wherein the gates of the first, second, third and fourth NMOS transistors are coupled to the gates of the first, second, third and fourth PMOS transistors respectively.

8. The ring-type voltage-controlled oscillator of claim 6, wherein the gates of the first and third PMOS transistor receive a third differential input signal and the gates of the second and fourth PMOS transistor receive a fourth differential input signal.

9. The ring-type voltage-controlled oscillator of claim 8, wherein the first and second differential input signals of one delay cell circuit are coupled to the third and fourth differential input signals of the next sequential delay cell circuit respectively, and the first and second differential output signals of the delay cell circuit are coupled to the second and first differential input signals of the next sequential delay cell circuit respectively.

10. The ring-type voltage-controlled oscillator of claim 1, wherein the differential delay circuit comprises a fifth PMOS transistor and a sixth PMOS transistor, wherein the fifth PMOS transistor comprises a gate coupled to the drain of the sixth PMOS transistor, the first resistance unit and the first terminal, the sixth PMOS transistor comprises a gate coupled to the drain of the fifth PMOS transistor, the second resistance unit and the second terminal, and the sources of the fifth and sixth PMOS transistor are coupled to the first power rail.

11. The ring-type voltage-controlled oscillator of claim 1, wherein the first and second resistance units further comprise a fifth NMOS and sixth NMOS transistors respectively, the fifth NMOS transistor is coupled between the first inverter and the differential delay circuit, the sixth NMOS transistor is coupled between the second inverter and the differential delay circuit, and the gates of the fifth and sixth transistors receive the resistance control voltage.

12. A delay cell circuit for a ring-type voltage-controlled oscillator comprising:

a first inverter comprising a first NMOS transistor having a gate receiving a first differential input signal, a drain generating a first differential signal and a source coupled to a second power rail and a first PMOS transistor having a drain coupled to the drain of the first NMOS transistor, and a source coupled to a first power rail;

a second inverter comprising a second NMOS transistor having a gate receiving a second differential input signal and a drain generating a second differential signal and a source coupled to the second power rail;

a first resistance unit coupled to the drain of the first NMOS transistor, receiving the first differential signal;

a second resistance unit coupled to the drain of the second NMOS transistor, receiving the second differential signal; and a differential delay circuit coupled to a the first power rail for generating a first differential output signal to a first terminal and the first resistance unit, and a second differential output signal to a second terminal and the second resistance unit;

wherein the first and second resistance units have a resistance value adjusted according to a resistance control voltage for controlling the strength of the first and second NMOS transistors so as to alter the time delay of the first and second differential output signals.

13. The delay cell circuit of claim 12, wherein the second inverter further comprises a_second PMOS transistors, and the second PMOS transistor comprises a drain coupled to the drain of the second NMOS transistor and a source coupled to the first power rail.

14. The delay cell circuit of claim 13, wherein the gates of the first and second NMOS transistors are coupled to the gates of the first and second PMOS transistors respectively.

15. The delay cell circuit of claim 13, wherein the gate of the first PMOS transistor receives a third differential input signal and the second PMOS transistors receives a fourth differential input signal.

16. The delay cell circuit of claim 15, wherein the phase of the third differential input signal is faster than the phase of the first differential input signal and the phase of the fourth differential input signal is faster than the phase of the second differential input signal.

17. The delay cell circuit of claim 13, wherein the delay cell circuit further comprises third and fourth inverters, wherein the third inverter comprises a third NMOS transistor having a gate receiving the first differential input signal, a drain coupled to the first terminal and a source coupled to the second power rail, and the fourth inverter comprises a fourth NMOS transistor having a gate receiving the second differential input signal, a drain coupled to the second terminal and a source coupled to the second power rail.

18. The delay cell circuit of claim 16, wherein the third and fourth inverters further comprise a third PMOS transistor and fourth PMOS transistor respectively, wherein the third PMOS transistor comprises a drain coupled to the drain of the third NMOS transistor, and a source coupled to the first power rail, and the fourth PMOS transistor comprises a drain coupled to the drain of the fourth NMOS transistor and a source coupled to the first power rail.

19. The delay cell circuit of claim 12, wherein the differential delay circuit comprises a fifth PMOS transistor and a sixth PMOS transistor, where the fifth PMOS transistor comprises a gate coupled to the drain of the sixth PMOS transistor, the first resistance unit and the first terminal, the sixth PMOS transistor comprises a gate coupled to the drain of the fifth PMOS transistor, the second resistance unit and the second terminal, and the sources of the fifth and sixth PMOS transistor are coupled to the first power rail.

20. The delay cell circuit of claim 12 wherein the first and second resistance units farther comprise fifth NMOS and sixth NMOS transistors respectively, the fifth NMOS transistor is coupled between the first inverter and the differential delay circuit, the sixth NMOS transistor is coupled between the second inverter and the differential delay circuit, and the gates of the fifth and sixth transistors receive the resistance control voltage.

* * * * *